United States Patent
Sharma et al.

(10) Patent No.: US 10,900,120 B2
(45) Date of Patent: Jan. 26, 2021

(54) PASSIVATION AGAINST VAPOR DEPOSITION

(71) Applicant: ASM IP HOLDING B.V., Almere (NL)

(72) Inventors: Varun Sharma, Helsinki (FI); Eva Tois, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 165 days.

(21) Appl. No.: 16/033,952

(22) Filed: Jul. 12, 2018

(65) Prior Publication Data

US 2019/0017170 A1 Jan. 17, 2019

Related U.S. Application Data

(60) Provisional application No. 62/532,877, filed on Jul. 14, 2017.

(51) Int. Cl.
*C23C 16/04* (2006.01)
*C23C 16/455* (2006.01)
(Continued)

(52) U.S. Cl.
CPC .... *C23C 16/45525* (2013.01); *C23C 16/0272* (2013.01); *C23C 16/042* (2013.01);
(Continued)

(58) Field of Classification Search
CPC ..................................................... C23C 16/04
See application file for complete search history.

(56) References Cited

U.S. PATENT DOCUMENTS

| 4,804,640 | A | 2/1989 | Kaganowicz |
| 4,863,879 | A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.

(Continued)

*Primary Examiner* — Elizabeth A Burkhart
(74) *Attorney, Agent, or Firm* — Knobbe, Martens, Olson & Bear, LLP

(57) ABSTRACT

Passivation layers to inhibit vapor deposition can be used on reactor surfaces to minimize deposits while depositing on a substrate housed therein, or on particular substrate surfaces, such as metallic surfaces on semiconductor substrates to facilitate selective deposition on adjacent dielectric surfaces. Passivation agents that are smaller than typical self-assembled monolayer precursors can have hydrophobic or non-reactive ends and facilitate more dense passivation layers more quickly than self-assembled monolayers, particularly over complex three-dimensional structures.

17 Claims, 7 Drawing Sheets

| X | PASSIVATION |
|---|---|
| DIELECTRIC | METALLIC |

(51) Int. Cl.

| | |
|---|---|
| *C23C 16/44* | (2006.01) |
| *C23C 16/18* | (2006.01) |
| *H01L 23/31* | (2006.01) |
| *H01L 21/02* | (2006.01) |
| *C23C 16/02* | (2006.01) |
| *C23C 16/40* | (2006.01) |
| *H01L 21/321* | (2006.01) |
| *H01L 21/32* | (2006.01) |

(52) U.S. Cl.
CPC ............ *C23C 16/18* (2013.01); *C23C 16/405* (2013.01); *C23C 16/4404* (2013.01); *H01L 21/0228* (2013.01); *H01L 21/02137* (2013.01); *H01L 21/02181* (2013.01); *H01L 21/02189* (2013.01); *H01L 21/321* (2013.01); *H01L 23/3171* (2013.01); *H01L 21/32* (2013.01)

(56) References Cited

U.S. PATENT DOCUMENTS

| | | |
|---|---|---|
| 4,948,755 A | 8/1990 | Mo |
| 5,288,697 A | 2/1994 | Schrepp et al. |
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 7,914,847 B2 | 9/2011 | Verghese et al. |
| 8,293,597 B2 | 10/2012 | Raaijmakers |
| 8,293,658 B2 | 10/2012 | Shero et al. |
| 8,425,739 B1 | 4/2013 | Wieting |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Kobrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,349,687 B1 | 5/2016 | Gates et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,049,924 B2 | 8/2018 | Haukka et al. |
| 10,115,603 B2 | 10/2018 | Niskanen et al. |
| 10,157,786 B2 | 12/2018 | Haukka et al. |
| 10,186,420 B2 | 1/2019 | Fukazawa |
| 10,428,421 B2 | 10/2019 | Haukka et al. |
| 10,480,064 B2 | 11/2019 | Longrie et al. |
| 10,546,741 B2 | 1/2020 | Murakami et al. |
| 2001/0019803 A1 | 9/2001 | Mirkanimi |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0219746 A1 | 11/2004 | Vaartstra et al. |
| 2005/0012975 A1 | 1/2005 | George et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121733 A1 | 6/2006 | Kilpela et al. |
| 2006/0128150 A1 | 6/2006 | Gandikota |
| 2006/0141155 A1 | 6/2006 | Gordon et al. |
| 2006/0176559 A1 | 8/2006 | Minoda et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0063317 A1 | 3/2007 | Kim et al. |
| 2007/0098894 A1* | 5/2007 | Verghese ............... B82Y 30/00 427/248.1 |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0311879 A1 | 12/2009 | Blasco et al. |

(56) References Cited

U.S. PATENT DOCUMENTS

| | | |
|---|---|---|
| 2010/0015756 A1 | 1/2010 | Weidman et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1* | 6/2011 | Chen ............... C23C 16/0245 134/1.1 |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0189868 A1 | 7/2012 | Borovik et al. |
| 2012/0219824 A1 | 8/2012 | Prolier et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0316080 A1 | 11/2013 | Yamaguchi et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0273477 A1 | 5/2014 | Swaminathan et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0272194 A1 | 9/2014 | Xiao et al. |
| 2014/0273290 A1 | 9/2014 | Somervell |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1* | 8/2015 | Haukka ................ C23C 16/02 427/343 |
| 2015/0240121 A1 | 8/2015 | Sugita et al. |
| 2015/0275355 A1 | 10/2015 | Mallikarjunan et al. |
| 2015/0299848 A1* | 10/2015 | Haukka ............. H01L 21/76829 427/123 |
| 2015/0371866 A1 | 12/2015 | Chen et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293398 A1 | 10/2016 | Danek et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0352533 A1 | 12/2017 | Tois et al. |
| 2017/0352550 A1 | 12/2017 | Tois et al. |
| 2018/0040708 A1 | 2/2018 | Narayanan et al. |
| 2018/0080121 A1 | 3/2018 | Longrie et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0341245 A1 | 11/2019 | Tois et al. |

FOREIGN PATENT DOCUMENTS

| | | |
|---|---|---|
| EP | 1340269 | 2/2009 |
| JP | 2011-187583 | 9/2011 |
| JP | 2014-93331 | 5/2014 |
| KR | 102001001072 | 2/2001 |
| KR | 20030027392 | 4/2003 |
| KR | 1020040056026 | 6/2004 |
| KR | 10-0920033 | 10/2009 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

File History of U.S. Appl. No. 16/588,600, filed Sep. 30, 2019.
File History of U.S. Appl. No. 16/836,151, filed Mar. 31, 2020.
Aaltonen et al., "Atomic Layer Deposition of Iridium Thin Films", Journal of the Electrochemical Society, 151 (8) G489-G492 (2004).
Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via https://en.wikipedia.org/wiki/Benzotriazole; pp. 1-5, no date available.

(56) References Cited

OTHER PUBLICATIONS

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al.,"Nucleation and growth during tungsten atomic layer deposition on SiO2 surfaces", Thin Solid Films, vol. 386, 2001 pp. 41-52.

Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly( methyl methacrylate) Films as Mask Layers, J. Phys. Chem. C, 2008, 112, pp. 15791-15795. (Year: 2008).

Farm et al., "Self-Assembled Octadecyltrimethoxysilane Monolayers Enabling Selective-Area Atomic Layer Deposition of Iridium", Chem. Vap. Deposition, 2006, 12, pp. 415-417.

Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.

File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 16/399,328, filed Apr. 30, 2019.
File History of U.S. Appl. No. 15/971,601, filed May 4, 2018.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.

Formic Acid, Wikipedia via https://en.wikipedia.org/wiki/Formic_acid; pp. 1-5, no date available.

George, Steven M., "Atomic Layer Deposition: An Overview", Chem. Rev. 2010, 110, pp. 111-113.

Ghosal et al., Controlling Atomic Layer Deposition of Ti02 in Aerogels through Surface Functionalization, Chem. Matter, vol. 21, pp. 1989-1992, 2009.

Grubbs et al., "Nucleation and growth during the atomic layer deposition of W on Al2O3 and Al2O3 on W", Thin Solid Films, vol. 467, 2004, pp. 16-27.

Hashemi et al., "A New Resist for Area Selective Atomic and Molecular Layer Deposition on Metal-Dielectric Patterns", J. Phys. Chem. C 2014, 118, pp. 10957-10962.

Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

International Search Report and Written Opinion dated Feb. 17, 2012 in Application No. PCT/US2011/039970, filed Jun. 10, 2011.

International Search Report and Written Opinion dated Aug. 8, 2018 in Application No. PCT/US2018/030974, filed May 3, 2018.

International Search Report and Written Opinion dated Jul. 24, 2018 in Application No. PCT/US2018/030979, filed May 3, 2018.

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.

Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.

Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.

Lee et al., Area-Selective Atomic Layor Deposition Using Self-Assembled Monolayer and Scanning Probe Lithography, Journal of the Electrochemical Society, vol. 156, Issue 9, pp. G125-G128, 2009.

Lei et al., "Real-time observation and opitimization of tungsten atomic layer deposition process cycle", J. Vac. Sci. Technol. B, vol. 24, No. 2, Mar./Apr. 2006, pp. 780-789.

Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.

Lemonds, A.M., "Atomic layer deposition of TaSix thin films on SiO2 using TaF5 and Si2H6", Thin Solid Films 488, 2005 pp. 9-14.

(56) References Cited

OTHER PUBLICATIONS

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25 μm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
Office Action dated Jun. 8, 2017 in Korean Application No. 2013-7000596.
Office Action dated Apr. 8, 2020 in Taiwan Application No. 105132286.
Overhage et al., Selective Atomic Layer Deposition (SALD) of Titanium Dioxide on Silicon and Copper Patterned Substrates, Journal of Undergraduate Research 4, 29, Mar. 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Schuiskly et al., "Atomic Layer Deposition of Thin Films Using O2 as Oxygen Source", Langmuir, vol. 17, No. 18, 2001, pp. 5508-5512.
Sundberg, et al.; Organic and Inorganic-Organic Thin Film Structures by Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov, et al.; Thermal Cyclodehydration of Polyamic Acid Initiated by UV-Irradiation; Iranian Polymer Journal; vol. 5, No. 1; pp. 1A323:C3286-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.
Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.
Vervuurt et al., "Area-selective atomic layer deposition of platinum using photosensitive polyimide", Nanotechnology 27, 2016, in 6 pages.
Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

\* cited by examiner

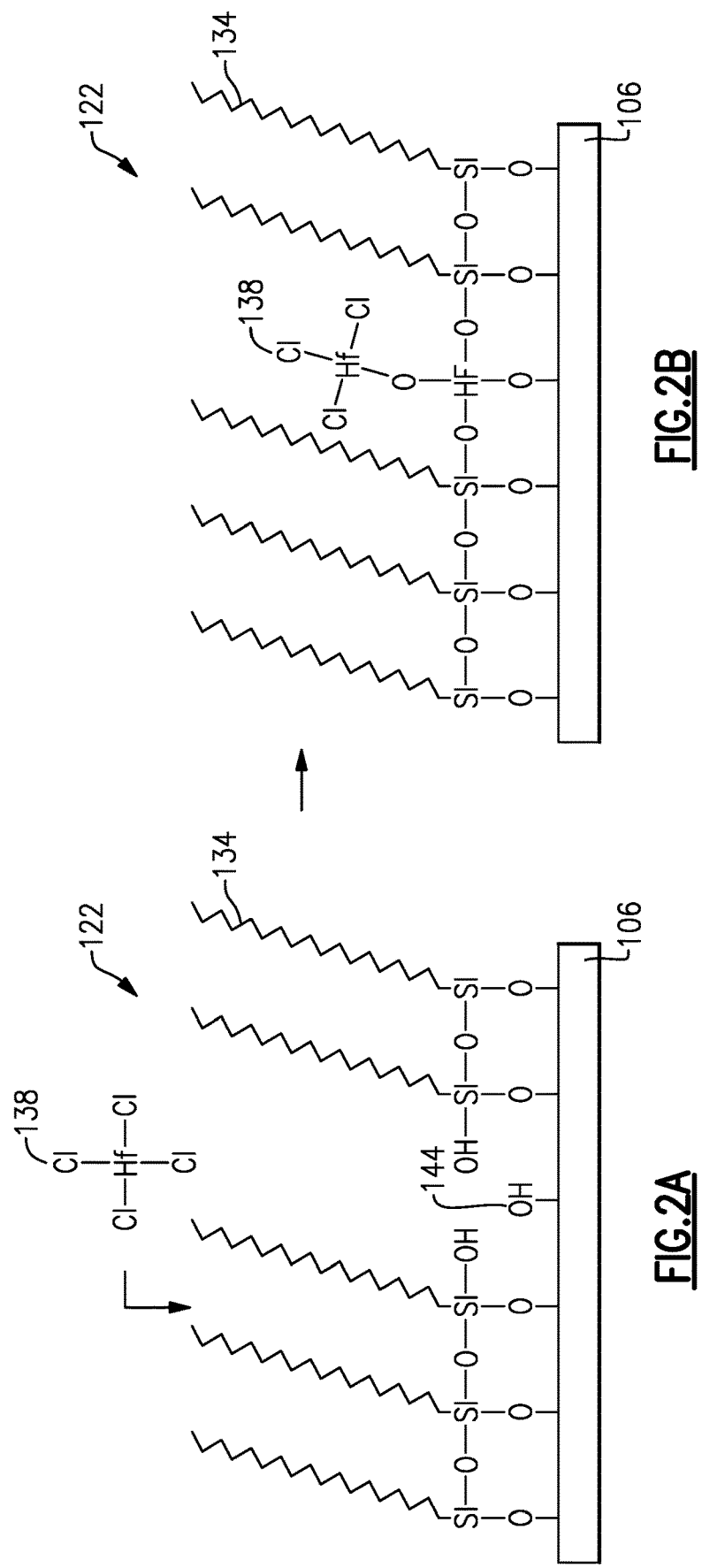

| DIELECTRIC | METALLIC |

FIG.3A

| | PASSIVATION |
| DIELECTRIC | METALLIC |

FIG.3B

| X | PASSIVATION |
| DIELECTRIC | METALLIC |

FIG.3C

| X | |
| DIELECTRIC | METALLIC |

FIG.3D

PASSIVATION AGAINST VAPOR DEPOSITION

PRIORITY APPLICATION

The present application claims priority to U.S. Provisional Application No. 62/532,877, filed Jul. 14, 2017.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

FIELD

This application relates generally to the passivation to inhibit vapor phase deposition on selected surfaces, such as reactor surfaces or select surfaces on a substrate.

BACKGROUND

Atomic layer deposition (ALD) is a known process in the semiconductor industry for forming thin films of materials on substrates, such as silicon wafers. ALD is a type of vapor deposition wherein a film is built up through self-saturating surface reactions performed in cycles. In an ALD process, gaseous precursors are supplied, alternatingly and repeatedly, to the substrate to form a thin film of material on the substrate. One reactant adsorbs in a self-limiting process on the wafer. A subsequent reactant pulse reacts with the adsorbed material to form a molecular layer of the desired material. The subsequent pulse can reduce or getter ligands from the adsorbed layer, can replace such ligands or otherwise add atoms (e.g., oxidize, nitridize, etc.). In a typical ALD reaction, no more than a molecular monolayer forms per cycle. Cycles can be more complex and involve three or more reactants in sequence. Some recognized advantages of ALD are low temperature processing and near perfect conformality, leading to great interest in ALD for semiconductor processing.

Other processes besides ALD exist for forming thin films of materials on substrates. One such process is chemical vapor deposition (CVD), in which a substrate is exposed to one or more volatile precursors which react and/or decompose on the substrate to form a thin film. Unlike pure ALD, mutually reactive reactants are often simultaneously exposed to the substrate in CVD. Hybrid ALD/CVD processes can allow some overlap of precursors to obtain some of the conformality advantages of ALD and some of the speed advantages of CVD. Both ALD and CVD can be sensitive to the exposed surface; depending upon the precursors and deposition conditions, vapor deposition processes can nucleate well or poorly on different surfaces.

Invariably, during processing, deposition occurs on exposed surfaces other than those for which deposition may be desired. For example, a film buildup can occur on exposed surfaces of a reactor as multiple substrates are processed in sequence. The film buildup can delaminate or flake from the reactor surfaces and contaminate the substrate surface. Large amounts of loosely adhered film buildup on the reactor surfaces also increases the total surface area exposed to a reactant pulse, thereby increasing the pulse and purge time required to saturate substrate surfaces. In addition, films can be deposited on undesirable areas of semiconductor device structures, such as dielectric surfaces, entailing additional patterning and etch steps.

Currently, selective processes are available that prevent or reduce the amount of unwanted film deposition on reactor surfaces and device structures. Some such processes utilize a treatment process that results in a protective self-assembled monolayer (SAM) over reactor surfaces, such as those described in U.S. Pat. Nos. 7,914,847 and 8,293,658, the disclosures of both of which are incorporated by reference herein in their entireties for all purposes. Other processes utilize a treatment process that results in a selective deposition on some types of substrate surfaces with minimal or no deposition on other substrate surfaces, such as the selective deposition processes described in U.S. Pat. No. 8,293,658, incorporated above, and U.S. Patent Publications No. 2016-0247695 A1, 2015-0299848 A1, 2015-0217330 A1, and U.S. Pat. No. 9,112,003, the disclosures of which are incorporated by reference herein in their entireties for all purposes.

Creating a SAM from the vapor phase, as opposed to a liquid phase, is advantageous for many reasons, including the ability to use of the same or similar type of apparatus as used in ALD and CVD. Organosilane based SAMs may be created through vapor phase processes, but such a SAM typically employs multiple and prolonged exposures in order to create a desired organosilane SAM.

SUMMARY

In one aspect a method for vapor-phase coating is provided. The method includes passivating a conductive surface against vapor-phase deposition, wherein passivating includes exposing the conductive surface to a vapor-phase passivating agent to form a passivated conductive surface. The method further includes selectively depositing a layer on a dielectric surface relative to the passivated conductive surface by exposing both the passivated conductive surface and the dielectric surface to vapor-phase deposition reactants.

In some embodiments, the passivating agent includes a molecule smaller than a self-assembled monolayer (SAM) precursor having a carbon chain greater than five (5) carbon atoms. In some embodiments, the passivating agent includes halogen terminations. In some embodiments, the passivated conductive surface includes hydrophobic terminations or terminations that are inert to the selective deposition of the vapor phase deposition reactants. In some embodiments, the passivating agent includes a compound with one or more alkyl chains, wherein the alkyl chains each have fewer than 5 carbon atoms. In some embodiments, the passivating agent includes a compound having a molecular mass of less than or equal to 330 g/mol.

In some embodiments, the passivating agent includes a haloalkane of the formulae $C_nH_{2n+1}X$, $C_nH_{2n}X_2$, $R^1R^2CX$ or $R^1R^2CX$. In some embodiments, $R^1$ and $R^2$ are each individually hydrogen or an alkyl group. In some embodiments, X is a halogen. In some embodiments, n is less than 5.

In some embodiments, the passivating agent includes a halogen containing silane, halogen containing germane or a compound of the formulae $SiH_2X_2$, $SiH_3X$, $GeH_2X_2$ or $GeH_3X$. In some embodiments, X is a halogen.

In some embodiments, the passivating agent includes a halogen containing silane, halogen containing germane, halogen containing stannane or compounds of the formulae $GeR_aX_b$, $SiR_aX_b$, $GeR_aH_cX_b$, $SiR_aH_cX_b$, $SnR_aX_b$, $SnR_aH_cX_b$, $Sn_2R_aH_cX_b$, $SiH_cXR_a$. In some embodiments, each R is individually a hydrogen or an alkyl group with less than 5 carbon atoms. In some embodiments, X is a halogen. In some embodiments, a, b and c are stoichiometric integral values each individually selected from 0, 1, 2, 3, 4, 5, 6, 7 or 8.

In some embodiments, the passivating agent includes a compound of the formulae RZ, $CF_2HZ$, $CFH_2Z$, $(CH_3)_3SiZ$, $CF_3Z$, $(CH_3)_3CZ$, $SnH_cR_aZ$, or $CH_cR_aZ$. In some embodiments, each R is individually a hydrogen or an alkyl group with less than 5 carbon atoms each. In some embodiments, Z is a alkyl, acetate, nitrile, isonitrile, isocyanate, amine, thiol, sulfonyl chloride, acyl chloride or alkoxy group. In some embodiments, a and c are stoichiometric integral values each individually selected from 0, 1, 2, 3 or 4.

In some embodiments, the passivating agent includes a compound of the formulae $R^1R^2SiX$ or $R^1R^2R^3SiX$. In some embodiments, $R^1$, $R^2$ and $R^3$ are each individually hydrogen or an alkyl group with less than 5 carbon atoms each. In some embodiments, X is a halogen.

In some embodiments, the passivating agent is not heated prior to introduction to exposing the conductive surface.

In some embodiments, the conductive surface includes a metallic surface. In some embodiments, the conductive surface includes one or more of TiN, W, Co, Cu, Ir or TaN. In some embodiments, the conductive surface includes one or more of TiN, W, Co, Cu or TaN.

In some embodiments, the dielectric surface includes an oxide or nitride surface. In some embodiments, the dielectric surface includes hafnium oxide, zirconium oxide, titanium oxide, silicon nitride or native oxide.

In some embodiments, selectively depositing includes atomic layer deposition. In some embodiments, selectively depositing includes depositing a dielectric layer. In some embodiments, selectively depositing further includes supplying water, $O_2$, $NH_3$ or $O_3$. In some embodiments, selectively depositing includes supplying a metal precursor including cyclopendienyl, alkyl, amido or alkoxy ligands.

In some embodiments, passivation of the conductive surface selectively forms the passivated conductive surface relative to the dielectric surface. In some embodiments, the passivation forms directly on the conductive surface without blocking passivation on the dielectric surface and without catalytic agents on the conductive surface. In some embodiments, passivation of the conductive surface is performed in about 1 day or less.

In another aspect a vapor-phase deposition process is provided. The process includes passivating a conductive surface against vapor-phase deposition, wherein passivating includes exposing the conductive surface to a passivating agent that includes a vapor-phase halide to form a passivated conductive surface. The process further includes selectively depositing a layer on a dielectric surface relative to the passivated conductive surface by exposing both the passivated conductive surface and the dielectric surface to vapor-phase deposition reactants.

In some embodiments, the conductive surface is a metal surface or metal nitride surface. In some embodiments, the conductive surface includes oxygen. In some embodiments, the conductive surface includes TiN and the dielectric surface includes $ZrO_2$.

In some embodiments, the passivating agent is an organic halide. In some embodiments, the passivating agent includes dichloromethane.

In some embodiments, the passivating agent includes a haloalkane of the formulae $C_nH_{2n+1}X$, $C_nH_{2n}X_2$, $R^1R^2$ CX or $R^1R^2$ CX. In some embodiments, $R^1$ and $R^2$ are hydrogen or alkyl groups. In some embodiments, X is a halogen. In some embodiments, n is less than 5.

In some embodiments, the passivating agent includes a halogen containing silane, halogen containing germane or a compound of the formulae $SiH_2X_2$, $SiH_3X$, $GeH_2X_2$ or $GeH_3X$. In some embodiments, X is a halogen.

In some embodiments, the passivating agent includes a halogen containing silane, halogen containing germane, halogen containing stannane or compounds of the formulae $GeR_aX_b$, $SiR_aX_b$, $GeR_aH_cX_b$, $SiR_aH_cX_b$, $SnR_aX_b$, $SnR_aH_cX_b$, $Sn_2R_aH_cX_b$, $SiH_cXR_a$. In some embodiments, each R is individually a hydrogen or an alkyl group with less than 5 carbon atoms. In some embodiments, X is a halogen. In some embodiments, a, b and c are stoichiometric integral values each individually selected from 0, 1, 2, 3, 4, 5, 6, 7 or 8.

In some embodiments, the passivating agent includes a halogen containing silane, halogen containing germane, halogen containing stannane or compounds of the formulae RZ, $CF_2HZ$, $CFH_2Z$, $(CH_3)_3SiZ$, $CF_3Z$, $(CH_3)_3CZ$, $SnH_cR_aZ$, or $CH_cR_aZ$. In some embodiments, each R is individually a hydrogen or an alkyl group with less than 5 carbon atoms each. In some embodiments, Z is a alkyl, acetate, nitrile, isonitrile, isocyanate, amine, thiol, sulfonyl chloride, acyl chloride or alkoxy group. In some embodiments, a and c are stoichiometric integral values each individually selected from 0, 1, 2, 3 or 4.

In some embodiments, the passivating agent includes a compound of the formulae $R^1R^2SiX$ or $R^1R^2$ $R^3SiX$. In some embodiments, $R^1$, $R^2$ and $R^3$ can be hydrogen or alkyl groups with less than 5 carbon atoms each. In some embodiments, X is a halogen.

In some embodiments, selectively depositing includes conducting an atomic layer deposition process.

In some embodiments, passivation of the conductive surface is performed in about 1 day or less.

BRIEF DESCRIPTION OF THE DRAWINGS

FIGS. 2A and 2B illustrate a surface having an overlying self-assembled monolayer with some unoccupied reactive sites exposed to an ALD precursor.

FIG. 3A is a schematic cross section of a portion of a substrate having first and second surfaces of different compositions, in accordance with a first embodiment.

FIG. 3B is a schematic cross section of the substrate of FIG. 3A after a selective passivation of the second surface.

FIG. 3C is a schematic cross section of the substrate of FIG. 3B after selective deposition on the first surface.

FIG. 3D is a schematic cross section of the substrate of FIG. 3C after removal of the passivation material from the second surface.

DETAILED DESCRIPTION

Processes are described herein for passivating surfaces, such as partially processed semiconductor substrate surfaces or semiconductor processing equipment surfaces, against vapor deposition processes. Processes taught herein are particularly useful for passivating conductive (for example, metallic) surfaces to allow for subsequent selective deposition on dielectric surfaces.

As noted in the Background section, processes exist to deactivate particular surfaces (e.g., reactor surfaces and surfaces of partially fabricated integrated circuit structures) against vapor deposition such as ALD to allow selective deposition on untreated surfaces. One such process involves forming a self-assembled monolayer (SAM) over exposed surfaces on which film deposition is not desired. A SAM is a relatively ordered assembly of molecules that spontaneously adsorb (also called chemisorb) from either vapor or liquid phase precursors on a surface. A typical SAM molecule includes a terminal functional group, a hydro-carbon chain and a head group. By forming a SAM over selected surfaces, the SAM can prevent film growth over the exposed surfaces using certain types of vapor precursors by blocking reactive sites on the exposed surface that would otherwise react with those deposition precursors. Such selective deactivation can be particularly effective against adsorption-driven processes, like ALD, but can also discourage certain types of CVD.

Figure 1B:
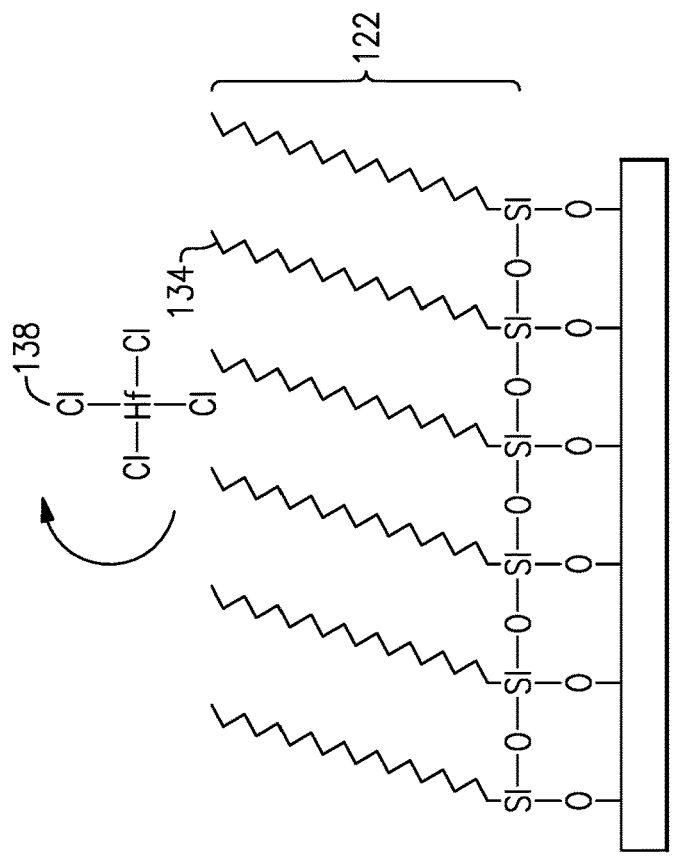
FIGS. 1A and 1B illustrate a surface having an overlying ideal, densely-packed self-assembled monolayer (SAM) exposed to an ALD precursor.
Figure 1A:
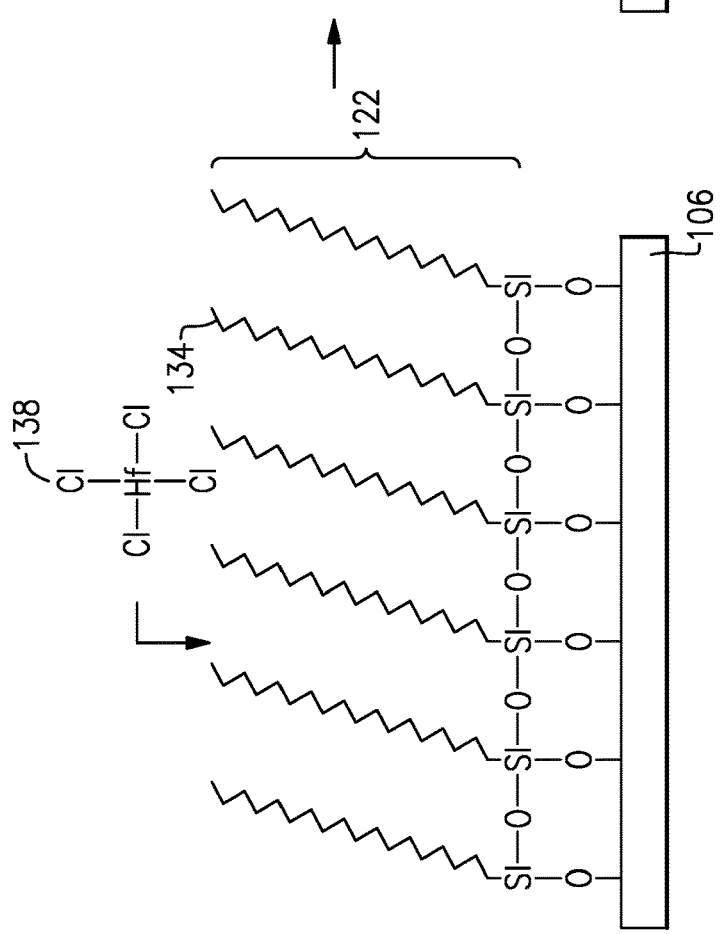

FIGS. 1A and 1B illustrate a surface 106 having an overlying ideal, densely-packed SAM 122 subjected to an ALD precursor 138. As noted above, the surface 106 can be any surface over which a subsequent deposition is to be inhibited. The formed SAM 122 is typically formed from relatively long chain monomers, typically including a carbon chain longer than 6 carbons in length, such as octadecyltrichlorosilane (ODTS), so that a highly ordered monolayer can be formed by self-assembly. The monomers that form the SAM can be delivered in liquid or vapor form. As shown in FIG. 1A, the SAM molecules 134 are theoretically densely-packed such that they occupy all of the reactive sites over the surface 106. During an ALD process, ALD precursors, such as $HfCl_4$, $ZrCl_4$, $TiCl_4$ or trimethyl aluminum (TMA) can be introduced into a reactor. These precursors will tend to react with exposed surfaces in the reactor, including reactor walls and exposed substrate surfaces. However, for those surfaces 106 having an overlying, densely-packed SAM 122 from a long-chain monomer, when the ALD precursors approach, as shown in FIG. 1A, the SAM 122 can prevent the underlying surface 106 from reacting with the ALD precursors by blocking the reactive sites of the underlying surface 106, as shown in FIG. 1B. By using the SAM 122 to block reactive sites, it is possible to deposit films on certain exposed surfaces while preventing or minimizing film deposition on other surfaces covered by the deactivating SAM, such that the deposition process is selective. In one example, insulators on a substrate can be blocked while deposition takes place on adjacent conductor surfaces of the same substrate. In another example, reactor walls can be blocked while deposition takes place on an untreated substrate in the reactor.

Large organic molecules can form self-assembled monolayers (SAMs) on the reactor surface that are very stable and do not easily desorb from the surface. In addition, large organic tails provide a desirable steric hindrance effect and do not allow the ALD reactant to reach the reactor surface.

Unfortunately, molecules of blocking SAMs rarely occupy every reactive site on the surface 106, such that the surfaces 106 underlying the SAM often have exposed reactive sites e.g., —OH termination sites (shown in FIG. 2A), that can undesirably react with deposition precursors. While not bound by theory, it is possible that steric hindrance can have this side effect: SAM molecules adsorbed on reactive sites can themselves interact with each other such that, rather than forming perfectly oriented, densely-packed molecules, the adsorbed SAM molecules cannot orient properly and thus they themselves preclude other SAM molecules from adsorbing with available reactive sites. Minimizing the unoccupied reactive sites typically means exposure to SAM monomers, typically in liquid precursors, for many hours or even days. Even after days of exposure to vapor or liquid phase SAM chemistries, reactive sites of underlying surfaces remain unoccupied and can act as nucleation sites for growth during subsequent deposition, particularly for smaller deposition precursors that are not blocked by steric hindrance in the imperfect SAM.

FIGS. 2A and 2B illustrate a surface 106 having a self-assembled monolayer 122 subjected to an ALD precursor 138. As shown in FIG. 2A, even after depositing the SAM 122 over the surface 106, the surface 106 has exposed native oxide hydroxyl groups that serve as reactive sites 144 accessible to ALD precursors 138 during deposition. Furthermore, it can be even more challenging to obtain full surface coverage with complex three-dimensional structures that are increasingly employed in semiconductor processing, such as MEMS devices, finFET structures, high aspect ratio capacitive structures, etc. As shown in FIG. 2B, when ALD precursors 138, such as $HfCl_4$, are introduced during a deposition process, the ALD precursors 138 can react with the exposed reactive sites 144, causing undesirable growth or nucleation.

Substrate Surfaces

According to some aspects of the present disclosure, selective deposition can be used to deposit films of interest on a second surface preferentially relative to a first surface. The two surfaces can have different material properties that permit selective formation of the passivation material thereon, such as selective formation of a passivation layer on the first surface relative to the second surface, which in turn permits subsequent selective deposition of a layer of interest on the second surface relative to the passivated first layer.

For example, in embodiments described herein, one of the surfaces can be a conductive (e.g., metal or metallic) surface of a substrate, while the other surface can be a non-conductive (e.g., inorganic dielectric) surface of the substrate. The material differences between the two surfaces are such that vapor deposition methods can selectively form the passivation layer on the first surface relative to the second surface. In some embodiments, cyclical vapor deposition is used, for example, cyclical CVD or atomic layer deposition (ALD) processes are used. In some embodiments, selectivity for forming the passivation layer can be achieved without passivation blocking agents on the surface to receive less of the passivation layer; and/or without catalytic agents on the surface to receive more of the passivation layer. For example, in embodiments where the first surface is metallic and the second surface is dielectric, the passivation layer can be selectively formed directly on metallic surfaces relative to dielectric surfaces. After selective formation of the passivation layer is completed, further selective deposition of materials of interest, such as dielectric layers on dielectric materials, can be conducted on the non-passivated second surface relative to the passivated first surface.

For embodiments in which one surface comprises a metal whereas the other surface does not, unless otherwise indicated, if a surface is referred to as a metal surface herein, it may be a metal surface or a metallic surface. In some embodiments, the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments, metal or a metallic surface comprises one or more transition metals. In some embodiments the metal or metallic surface comprises one or more of TiN, W, Co, Cu, Ir or TaN. In some embodiments the metal or metallic surface comprises one or more of Al, Ni, Nb, Fe. In some embodiments the metal or metallic surface comprises one or more noble metals, such as Ru. In some embodiments, the metal or metallic surface comprises a conductive metal oxide, nitride, carbide, boride, or combination thereof. For example, the metal or metallic surface may comprise one or more of $RuO_x$, $NbC_x$, $NbB_x$, $NiO_x$, $CoO_x$, $NbO_x$, $WNC_x$, TaN, or TiN. In experiments noted below, a metallic surface comprises titanium nitride.

In some embodiments a metal or metallic surface comprises cobalt (Co), copper (Cu) or tungsten (W). In some embodiments, the metal or metallic surface may be any surface that can accept or coordinate with the passivating agents described herein utilized in a selective deposition process of the passivation layer.

In some embodiments a passivation material is selectively deposited on a first surface which is an oxidized surface of metallic material relative to a second dielectric surface In some embodiments, the first surface is a metal or metallic surface of a substrate and the other surface is a dielectric surface of the substrate. The term dielectric is used in the description herein for the sake of simplicity in distinguishing from the other surface, namely the metal or metallic surface. It will be understood by the skilled artisan that not all non-conducting surfaces are dielectric surfaces, and conversely not all metallic surfaces are conducting. For example, the metal or metallic surface may comprise some oxidation that that can produce high resistivity. Selective deposition processes taught herein can deposit on dielectric surfaces with minimal deposition on passivated metallic surfaces regardless of the degree of conductivity.

In some embodiments the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments the substrate surfaces may be exposed to plasma, radicals, excited species, and/or atomic species prior to or at the beginning of the selective passivation. In some embodiments, the substrate surface may be exposed to hydrogen plasma, radicals, or atomic species prior to or at the beginning of the selective passivation. In some embodiments, the substrate surface may be thermally treated with exposure to hydrogen, ammonia, and mixtures thereof prior to or at the beginning of the selective passivation. In some embodiments, a pretreatment or cleaning process may be carried out in the same reaction chamber as a selective deposition process, however in some embodiments a pretreatment or cleaning process may be carried out in a separate reaction chamber, and the passivation process may also be conducted in a separate chamber from the subsequent selective deposition.

Examples of the dielectric surface which is not passivated, and on which selective deposition can take place after passivating the conductive surface, include inorganic dielectric materials, such as hafnium oxide, zirconium oxide, titanium oxide, native oxide on silicon, silicon nitride, silicon oxynitride, etc.

Selectivity

The skilled artisan will appreciate that selective formation of the passivation layer and the subsequent layer of interest can be fully selective or partially selective. A partially selective process can result in fully selective layer by a post-deposition etch that removes all of the deposited material from over surface B without removing all of the deposited material from over surface A. Because a simple etch back process can leave a fully selective structure without the need for expensive masking processes, the selective deposition need not be fully selective in order to obtain the desired benefits.

Selectivity of deposition on surface A relative to surface B can be given as a percentage calculated by [(deposition on surface A)−(deposition on surface B)]/(deposition on the surface A). Deposition can be measured in any of a variety of ways. For example, deposition may be given as the measured thickness of the deposited material, or may be given as the measured amount of material deposited. In embodiments described herein, selective formation of a passivation layer can be conducted on a first surface (A) relative to a second surface (B). Subsequently, a layer of interest is selectively deposited on the second surface (which becomes A for purposes of applying the above formula) relative to the passivation layer (which becomes B for purposes of applying the above formula) over the first surface.

In some embodiments, selectivity for the selective formation of the passivation layer on the first surface (relative to the second surface) and/or selectivity of the layer of interest on the second surface (relative to the passivation layer on the first surface) is greater than about 10%, greater than about 50%, greater than about 75%, greater than about 85%, greater than about 90%, greater than about 93%, greater than about 95%, greater than about 98%, greater than about 99% or even greater than about 99.5%. Depending on the surfaces and precursor chemistries, the selectivity of deposition over dielectric surfaces, relative to passivated metallic surfaces can change over the duration or thickness of a deposition. If that is the case, selectivity can be improved by repeating the exposure to the passivation agent, for example cycling between multiple ALD cycles and a passivation process.

In some embodiments, the passivation layer forms only on the first surface and does not form on the second surface. In some embodiments, deposition on surface A of the substrate relative to surface B of the substrate is at least about 80% selective, which may be selective enough for some particular applications. In some embodiments, deposition on the surface A of the substrate relative to surface B of the substrate is at least about 50% selective, which may be selective enough for some particular applications. In some embodiments the deposition on surface A of the substrate relative to the surface B of the substrate is at least about 10% selective, which may be selective enough for some particular applications. The skilled artisan will appreciate that a partially selective process can result in fully selective structure layer by a post-deposition etch that removes all of the deposited material from over surface B without removing all of the deposited material from over surface A.

In some embodiments, the passivation layer is selectively formed on the first surface of the substrate and may have a thickness less than about 3 nm, less than about 2 nm, or less than about 1 nm, while a ratio of material deposited on the first surface of the substrate relative to the second surface of the substrate may be greater than or equal to about 2:1, greater than or equal to about 20:1, greater than or equal to about 15:1, greater than or equal to about 10:1, greater than or equal to about 5:1, greater than or equal to about 3:1, or greater than or equal to about 2:1.

In some embodiments, the selectivity of the selective deposition processes described herein may depend on the materials which comprise the first and/or second surface of the substrate. For example, in some embodiments where the first surface comprises a passivated Cu surface and the second surface comprises a natural or chemical silicon dioxide surface, the selectivity of the layer of interest may be greater than about 8:1 or greater than about 15:1. In some embodiments, where the first surface comprises a metal and the second surface comprises a natural or chemical silicon dioxide surface the selectivity may be greater than about 5:1 or greater than about 10:1.

Passivation of Conductive Surfaces and Selective Deposition on Dielectric

FIGS. 3A-3D schematically illustrate a first embodiment for selective passivation of a first surface relative to a second surface, followed by selective deposition on the second surface relative to the passivated first surface. In the illustrated embodiment, the first surface comprises a metallic material; the second surface comprises a dielectric material; and the material of interest deposited on the second surface comprises a dielectric material. Thus, an embodiment comprises selective dielectric-on-dielectric deposition.

FIG. 3A illustrates a substrate having materially different surfaces exposed. For example, the first surface can comprise a metal, such as titanium nitride (TiN), tungsten (W), cobalt (Co), copper (Cu) or tantalum nitride (TaN). The second surface can comprise a dielectric, such as a low-k layer (typically a silicon oxide-based layer), a silicon surface having native oxide (also a form of silicon oxide) formed thereover, hafnium oxide ($HfO_x$), zirconium oxide ($HfO_x$), titanium oxide ($TiO_x$), silicon nitride ($SiN_x$), etc.

FIG. 3B shows the substrate of FIG. 3A after selective deposition of a passivation layer over the first surface. For example, the passivation layer may be formed by exposing the patterned surface of FIG. 3A to dichloromethane (DCM). Further information and examples of selective formation of the passivation layer using small molecules with hydrophobic or non-reactive ends are provided below.

FIG. 3C shows the substrate of FIG. 3B following selective deposition of a layer of interest X on the second surface (a dielectric surface in this example) relative to the passivation layer on the first surface. The layer of interest X can be a dielectric material, particularly a metal nitride or metal oxide such as zirconium oxide, hafnium oxide or titanium oxide. Precursors for selective dielectric deposition include, without limitation, metal precursors including cyclopentadienyl, alkyl, amido and and/or alkoxy ligands; and oxygen or nitrogen precursors such as $H_2O$, $O_2$, $NH_3$, or $O_3$. Methods for selectively depositing such metal oxide layers by vapor deposition techniques, employing hydrophobic precursors to aid selectivity relative to some types of passivation layers, are disclosed in US Patent Pub. No. 2017/0323776, the entire disclosure of which is incorporated herein by references for all purposes. Further information and examples of selective deposition of metal oxide and other layers of interest are provided below.

Any X material deposited on the passivation layer over the first surface can be removed by an etch back process. Because the layer of interest is deposited selectively on the second surface, any X material left on the passivation surface will be thinner than the passivation layer formed on the metallic surface. Accordingly, the etch back process can be controlled to remove all of the X material over the passivation layer without removing all of the layer of interest from over the dielectric surface. Repeatedly depositing selectively and etching back in this manner can result in an increasing thickness of the X material on the dielectric with each cycle of deposition and etch. Alternatively, any X material formed on the passivation layer can be removed during subsequent removal of the passivation layer as illustrated in FIG. 3D below, in a lift-off process. As is known in the art, a lift-off process removes an overlying material by undercutting with removal of an underlying material. Any X material formed on the passivation layer in a short selective deposition process tends to be noncontinuous, allowing access of the etchant to the underlying material to be removed. The lift-off etch need not fully remove the passivation layer in order to remove all of the undesired X material from the passivation layer surface, such that either a direct etch or the lift-off method can be used to remove the X material from the passivation layer surface in a cyclical selective deposition and removal.

FIG. 3D shows the substrate of FIG. 3C after removal of the passivation layer from the first surface. In some embodiments, the etch process may comprise exposing the substrate to a plasma. In some embodiments, a passivation layer can be removed by plasma comprising oxygen atoms, oxygen radicals, oxygen plasma, or combinations thereof. In some embodiments, the plasma may comprise hydrogen atoms, hydrogen radicals, hydrogen plasma, or combinations thereof. In some embodiments, the plasma may also comprise noble gas species, for example Ar or He species. In some embodiments the plasma may consist essentially of noble gas species. In some instances, the plasma may comprise other species, for example nitrogen atoms, nitrogen radicals, nitrogen plasma, or combinations thereof. In some embodiments, the etch process may comprise exposing the substrate to an etchant comprising oxygen, for example $O_3$. In some embodiments, the substrate may be exposed to an etchant at a temperature of between about 30° C. and about 500° C., preferably between about 100° C. and about 400° C. In some embodiments, the etchant may be supplied in one continuous pulse or may be supplied in multiple shorter pulses. As noted above, the passivation layer removal can also lift-off any remaining X material from over the passivation layer, either in a complete removal of the passivation layer or in a partial removal of the passivation layer in a cyclical selective deposition and removal.

Additional treatments, such as heat or chemical treatment, can be conducted prior to, after or between the foregoing processes. For example, treatments may modify the surfaces or remove portions of the metal, silicon oxide, passivation and metal oxide surfaces exposed at various stages of the process. In some embodiments the substrate may be pretreated or cleaned prior to or at the beginning of the selective deposition process. In some embodiments, the substrate may be subjected to a plasma cleaning process prior to or at the beginning of the selective deposition process. In some embodiments, a plasma cleaning process may not include ion bombardment, or may include relatively small amounts of ion bombardment. For example, in some embodiments the substrate surface may be exposed to plasma, radicals, excited species, and/or atomic species prior to or at the beginning of the selective deposition process. In some embodiments, the substrate surface may be exposed to hydrogen plasma, radicals, or atomic species prior to or at the beginning of the selective deposition process. In some embodiments, a pretreatment or cleaning process may be carried out in the same reaction chamber as a selective deposition process; however in some embodiments a pretreatment or cleaning process may be carried out in a separate reaction chamber.

In some embodiments, passivation of a surface is performed in about 1 day or less, about 12 hours or less, about 6 hours or less, about 2 hours or less or about 1 hours or less, or any range between any of these values.

Passivation Precursors

As noted above, SAMs can take a long time (days) to fully form a dense, effective barrier to inhibit deposition. The large molecules can interfere with access to all reactive sites on the surface to be deactivated against subsequent vapor phase deposition.

Accordingly, the present disclosure employs smaller passivating agents than the typical SAM precursors. Smaller agents that have hydrophobic or non-reactive ends include, for example, $CH_2X_2$, $CH_3X$, where X is a halogen, and other examples listed below. The smaller molecules can more quickly passivate surfaces of interest.

In some embodiments, the passivation precursors comprise haloalkanes of the formulae $C_nH_{2n+1}X$, $C_nH_{2n}X_2$, $R^1R^2$ CX or $R^1R^2$ CX, where:

R$^1$ and R$^2$ can be hydrogen or alkyl groups; and

X can be a halogen, such as chlorine (Cl), fluorine (F), bromine (Br) or iodine (I).

The foregoing haloalkanes and other passivation precursors described are particularly beneficial for dense passivation with minimal exposure times, and are small molecules with n<5. Many such molecules may have sufficiently high vapor pressure even at room temperature for vapor phase delivery to the surface to be passivated, such that the passivating agent source need not be heated. Heated vapor sources, such as bubblers and evaporators, can reduce the efficiency of the system by causing some amount of thermal decomposition. While longer chain organic molecules (e.g., n≥5) can also be employed in some embodiments, as the molecules increase in size heating becomes more desirable to obtain sufficient vapor pressure for delivery, and dense pin-hole free passivation layers become difficult to achieve or entail long exposure times.

In some embodiments, small passivating agents may have a molecular mass of less than or equal to 330 g/mol, less than or equal to 250 g/mol, less than or equal to 170 g/mol, less than or equal to 120 g/mol or less than or equal to 60 g/mol, or any range between any of these values. For example, in some embodiments small passivating agents with a molecular mass of less than or equal to 250 g/mol may be trimethylsilylthiol, trichlorostannane, dichlorostannane, chlorostannane, dimethylsilanethiol, and methylsilanethiol. In some embodiments, other examples of small passivating agents with a molecular mass of less than or equal to 120 g/mol include dichloromethane (DCM) and trifluoromethyl thiol. In some embodiments, other examples of small passivating agents with a molecular mass of less than or equal to 60 g/mol include chloromethane, methanethiol, methanenitrile, methylcyanate and methanisonitrile. In some embodiments, other examples of small passivating agents with a molecular mass of less than or equal to 330 g/mol include hexamethylditin and chloropentamethylditin. In some embodiments, small passivating agents may have a total number of atoms in one molecule of the small passivating agent of less than or equal to 5, less than or equal to 7, less than or equal to 10, less than or equal to 15, less than or equal to 20 or less than or equal to 25 atoms, or any range between any of these values.

In some embodiments, the small passivating agent may be an organic unsaturated alkane. In some embodiments, the organic alkane may contain less than or equal to 5 carbon atoms, less than or equal to 4 carbon atoms, less than or equal to 3 carbon atoms, less than or equal to 2 carbon atoms, or less than or equal to one carbon atom, or any range between any of these values. For example, in some embodiments organic alkanes that contain less than or equal to 5 carbon atoms include propanediene, butadiene and propene. In another example, in some embodiments haloalkanes that contain less than or equal to 5 carbon atoms include dichloromethane (DCM) and chloromethane.

In some embodiments, the passivating agents comprise halosilanes or halogermanes of the formulae $SiH_2X_2$, $SiH_3X$, $GeH_2X_2$, or $GeH_3X$, or of the general formulae $GeR_aX_b$, $SiR_aX_b$, $GeR_aH_cX_b$, or $SiR_aH_cX_b$ where:

R can be hydrogen or alkyl groups;

X can be a halogen, such as Cl, F, Br or I; and a, b and c are stoichiometric integral values each individually selected from 0, 1, 2, 3 or 4.

In some embodiments, the passivating agents comprise halostannanes of the formulae $SnH_3X$, $SnH_2X_2$, or $SnH_3X$, or of the general formulae $SnR_aX_b$, $SnR_aH_cX_b$ or $Sn_2R_aH_cX_b$ where:

R can be hydrogen or alkyl groups;

X can be a halogen, such as Cl, F, Br or I; and a, b and c are stoichiometric integral values each individually selected from 0, 1, 2, 3, 4, 5, 6, 7 or 8.

In some embodiments, the passivating agents comprise compounds of the formulae RZ, $CF_2HZ$, $CFH_2Z$, $(CH_3)_3SiZ$, $CF_3Z$, $(CH_3)_3CZ$, $SnH_cR_aZ$, or $CH_cR_aZ$ where:

R can be hydrogen or alkyl groups;

Z can be a functional group. In some embodiments, Z can be an alkyl, acetate, nitrile, isonitrile, isocyanate, amine, thiol, sulfonyl chloride, acyl chloride or alkoxy group. For example, in some embodiments, Z may be methoxy, ethoxy, methanesulfonylchloride, fumarylchloride, trifluoroethanesulfonylchloride, isobutanesulfonylchloride, trifluoromethylthiol, trimethylsilylazide, trimethylsilylacetate, or methyl; and a and c are stoichiometric integral values each individually selected from 0, 1, 2, 3 or 4.

In some embodiments, the passivating agents comprise compounds of the formulae $R^1R^2SiX$ or $R^1R^2 R^3SiX$, where:

$R^1$, $R^2$ and $R^3$ can be hydrogen or alkyl groups;

X can be a halogen, such as Cl, F, Br or I.

The foregoing compounds may include more than two halogen atoms per molecule, such as 1, 2 dichlorethane, and can have functional groups such as F or alkoxy groups.

In some embodiments, the small passivating agents may co-ordinate to a metal surface. In some embodiments, the small passivating agents may react with functionalized dielectric surfaces. In some embodiments, the small passivating agent comprises an alkyl group. In some embodiments, the alkyl group may contain less than or equal to 10, 7, 5, 4 or 3 carbon atoms, or any range between any of these values.

Process Flows

FIGS. 4-7 provide examples of process flows for passivation and selective deposition.

Figure 4:
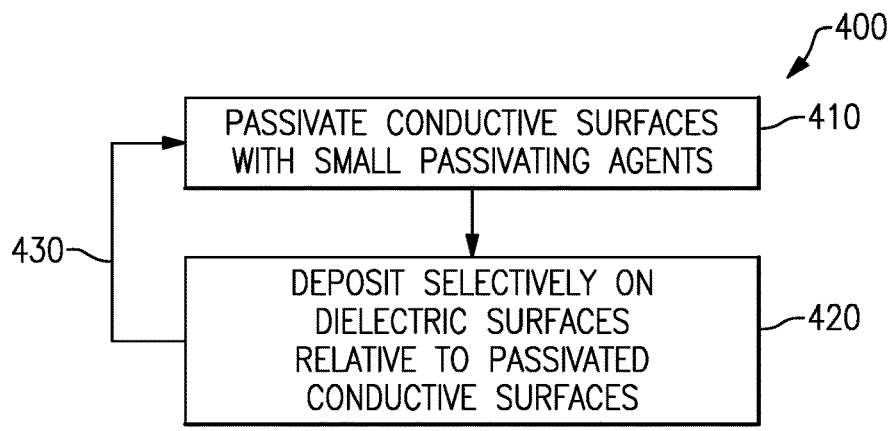
FIG. 4 is a flow chart illustrating a process for passivation and selective deposition in accordance with various embodiments.

Referring initially to FIG. 4, a process 400 comprises passivating 410 conductive surfaces with small molecule passivating agents. As noted above, small is in comparison to conventional SAM precursors, which typically include relative long (>5) carbon chains that provide both a high degree of self-ordering as well as stability. Suitable classes and examples of passivating agents are provided above, typically including hydrophobic or otherwise non-reactive terminations facing away from the conductive surface being passivated. The conductive surface can comprise, for example, metallic surfaces of a reactor or conductors on a partially fabricated integrated circuit. The passivation can be selective, for example, by failing to adhere to dielectric materials.

Following passivation 410, a material is selectively deposited 420 on dielectric surfaces, relative to the passivated conductive surfaces. Examples include surface-sensitive vapor deposition processes, such as a CVD and ALD, which processes can be inhibited or even deactivated by the passivation 410. Selectivity can be absolute but can be significantly less than absolute, especially in view of the likely subsequent removal of the passivation layer which would undercut and remove any deposition over the passivation layer. The dielectric could be on a substrate loaded into a reactor after reactor surface passivation, or could be on a dielectric surface adjacent passivated conductors on the same substrate.

It is possible that the passivation 410 may suffice for the duration of the selective deposition 420. However, it is possible that the passivation 410 cannot endure particularly lengthy deposition processes, particularly reactive deposition reactants or particularly harsh deposition conditions (e.g., high temperature, such as greater than about 420° C. and particularly higher than about 450° C.). In such circumstances, it may be desirable to repeat 430 passivating 410 and selectively depositing 420 in a cyclical fashion.

Figure 5:
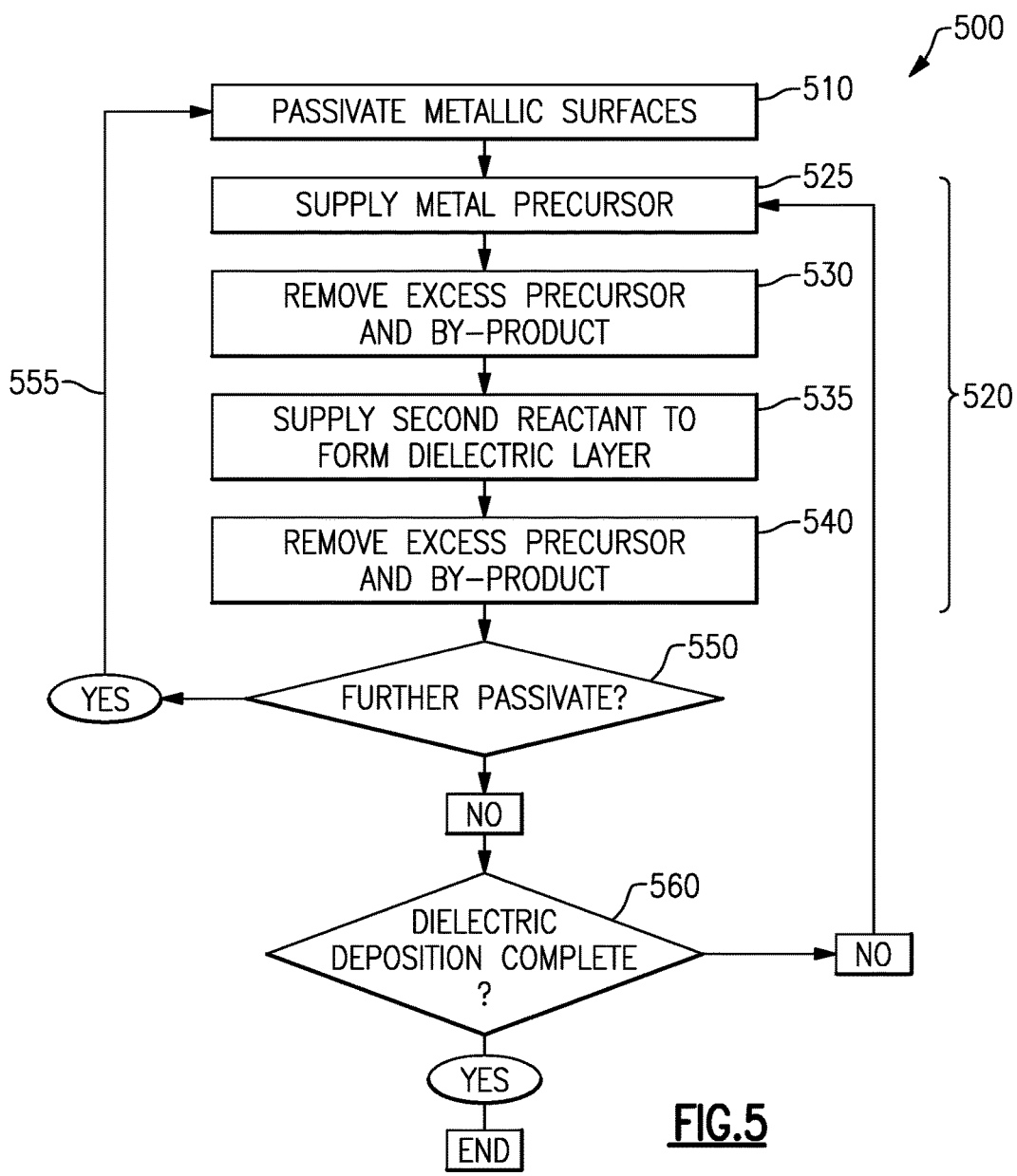
FIG. 5 is a flow chart illustrating passivation and selective ALD in accordance with some embodiments.

Referring now to FIG. 5, a more particular example process 500 includes initially passivating 510 metallic surfaces, followed by an ALD sequence 520. The illustrated sequence includes supplying 525 a metal precursor, removing 530 any excess precursor and by-product from the surface of interest, supplying 535 a second reactant to form a dielectric material, and removing 540 any excess precursor and by-product from the surface of interest. The ALD sequence 520 can selectively deposit the dielectric material, generally less than about a monolayer per cycle, on dielectric surfaces relative to the passivated metallic surfaces. As noted with respect to repeating 430 in FIG. 4, after numerous cycles it is possible that on average the passivation should be refreshed. This is indicated in FIG. 5 by decision box 550, where it is decided whether further passivation is desirable. If so, the process can loop or repeat 555 the process beginning with passivating 510 the metallic surfaces. If not, it is determined at decision box 560 whether deposition is complete. If not, the ALD cycle 520 can be repeated.

Figure 6:
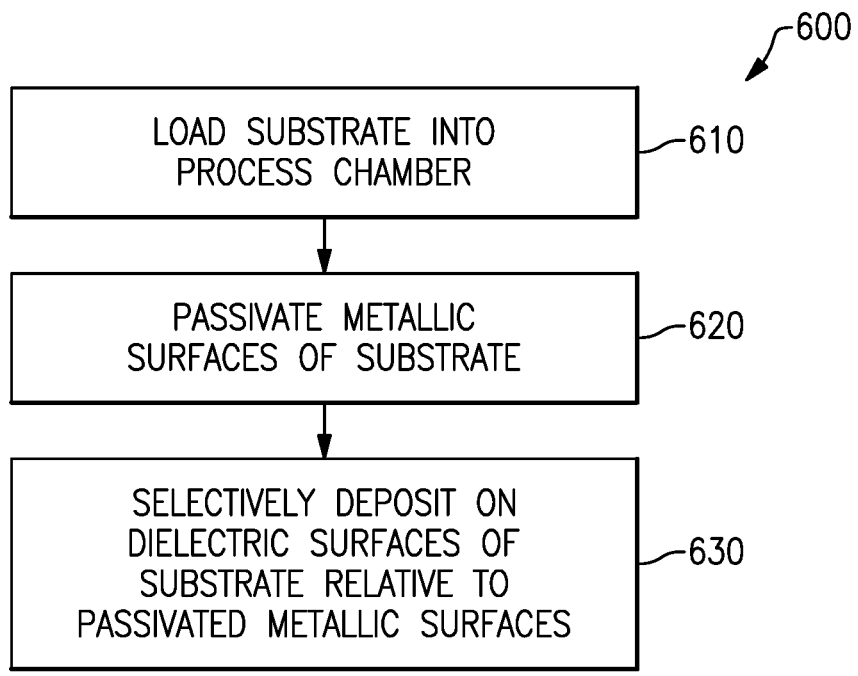
FIG. 6 is a flow chart illustrating a process for passivating some surfaces of a substrate and selectively depositing over other surfaces of the substrate.

FIG. 6 illustrates a particular example of a process 600 for passivating portions of a substrate and selectively depositing on other portions of the substrate. In particular, the process 600 can include loading 610 a substrate into a process chamber. Metallic surfaces of the substrate are passivated 620 in the process chamber. Subsequently, a selective deposition 630 is performed on dielectric surfaces of the substrate, relative to the passivated metallic surfaces. The selective deposition 630 can be a surface-sensitive process, such as CVD or ALD, and can deposit, for example, dielectric metal oxide on the dielectric surfaces with minimal or no deposition on the passivated metallic surfaces. The selective deposition 630 can be performed in the same chamber as the passivation 620, can be performed in different chambers of the same cluster tool (see discussion of experiments below) or can be performed in different tools altogether. While not shown, the process may cyclically passivate 620 and selectively deposit 630 for improving selectivity or refreshing the passivation after harsh conditions wear the passivation out.

Figure 7:
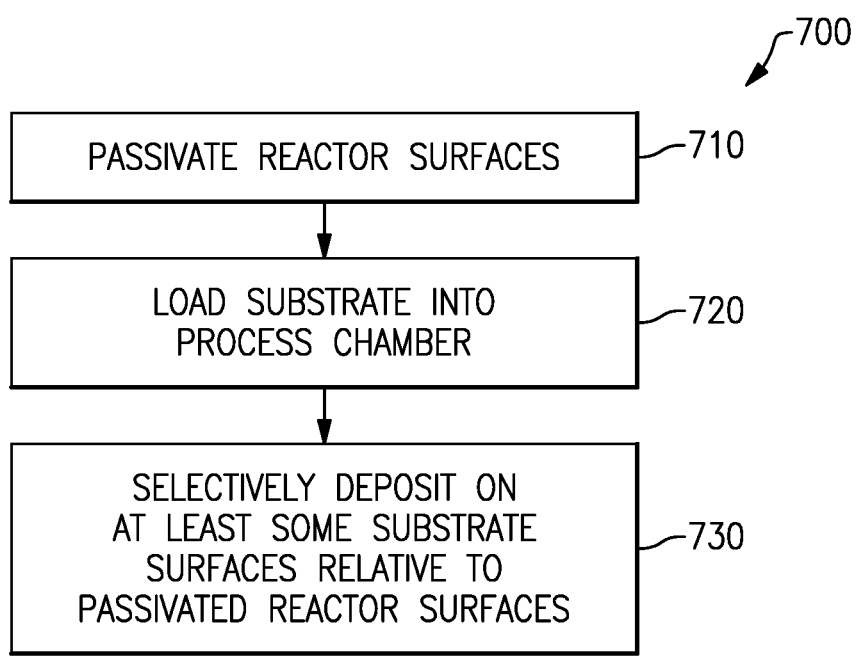
FIG. 7 is a flow chart illustrating a process for passivating reactor surfaces against a subsequent deposition on a substrate within the reactor process chamber.

FIG. 7 illustrates a particular example of a process 700 for passivating reactor surfaces and depositing selectively on a substrate relative to the reactor surfaces. In particular, the process 600 includes passivating 710 reactor surfaces, such as by supplying the passivating agents to the reactor surfaces. Reactor surfaces may include interior surfaces of a process chamber in which a substrate is to be processed, and may also include adjacent surfaces exposed to the processing reactants, such as inlet and outlet surfaces. A substrate is then loaded 720 into the process chamber of the reactor, and a selective deposition 730 is performed on at least some surfaces of the substrate, relative to the passivated metallic surfaces of the reactor. The selective deposition 730 can be a surface-sensitive process, such as CVD or ALD, and can deposit, for example, dielectric metal oxide on the dielectric surfaces on the substrate, with minimal or no deposition on the passivated metallic surfaces of the reactor.

Experimental Results

Figure 8:
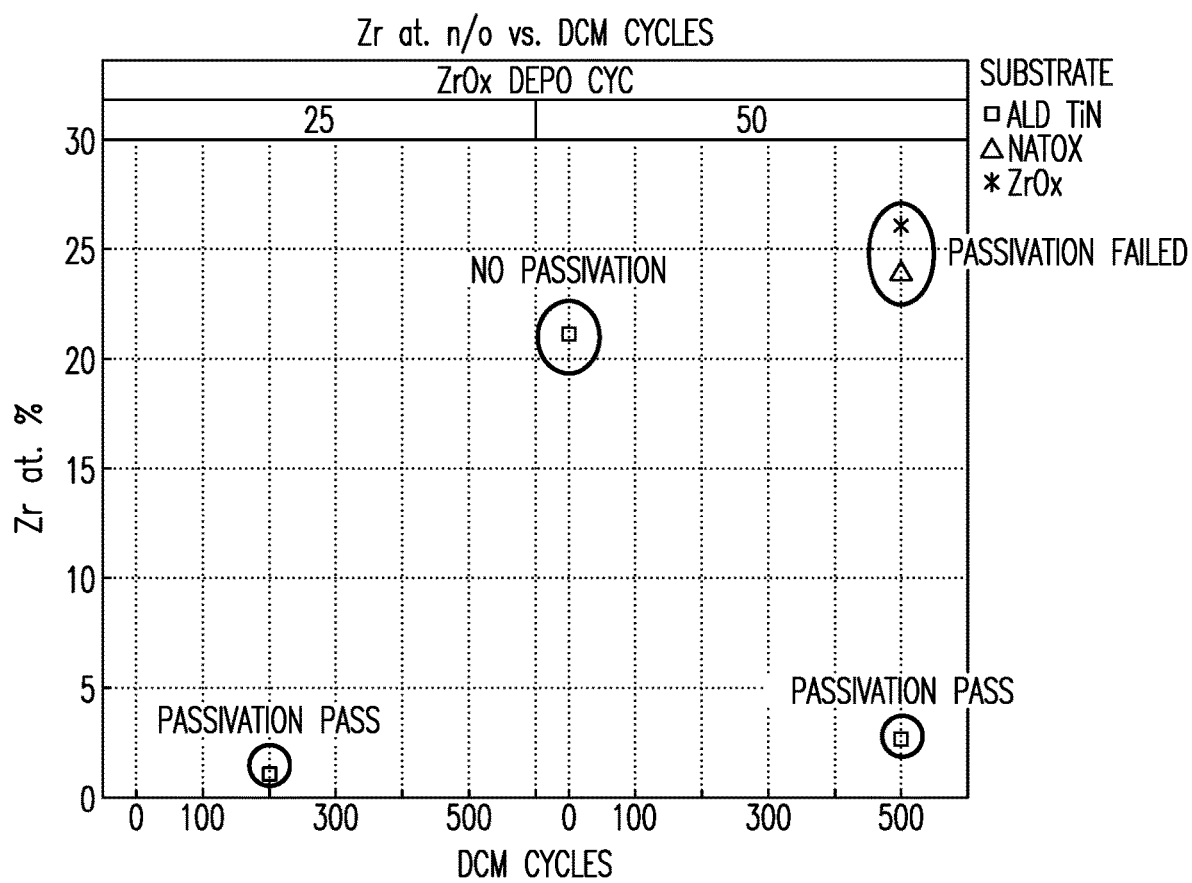
FIG. 8 is a graph showing experimental results for various numbers of cycles of atomic layer deposition of a dielectric on different types of surfaces after exposure to a passivation agent.

FIG. 8 illustrates the results of experiments with passivation of various materials with a small molecule passivating agent and the effects on subsequent ALD of a dielectric thereafter. In particular, various materials (TiN, native oxide on silicon, $ZrO_x$) were exposed to multiple pulses (200 or 500) of dichloromethane (DCM) as the passivating agent at 420° C. in a process chamber of a cluster tool. Subsequently, the substrates were each subjected to multiple cycles (25 or 50) of an ALD process for $ZrO_x$, including alternate exposure of the substrates to $ZrDO_4$ and water at 150° C. in an ALD process chamber of the same cluster tool, without breaking vacuum. Despite exposure to 500 cycles of DCM passivating agent, none of the dielectric materials were passivated against the subsequent $ZrO_2$ ALD. Without any exposure to the passivating agents ("No passivation"), $ZrO_2$ readily deposited on TiN, as indicated over 20 at. % Zr as measured by XPS analysis, indicating that the $ZrO_2$ ALD process will deposit on unpassivated TiN. However, the passivated TiN obtained only 3 at. % Zr as measured by XPS analysis, even after 50 cycles of $ZrO_2$ ALD. Accordingly, DCM successfully passivated the conductive surface against $ZrO_2$ ALD without passivating the dielectric surfaces. It is expected that further cycling of passivation and deposition can obtain even better selectivity.

Figure 9:
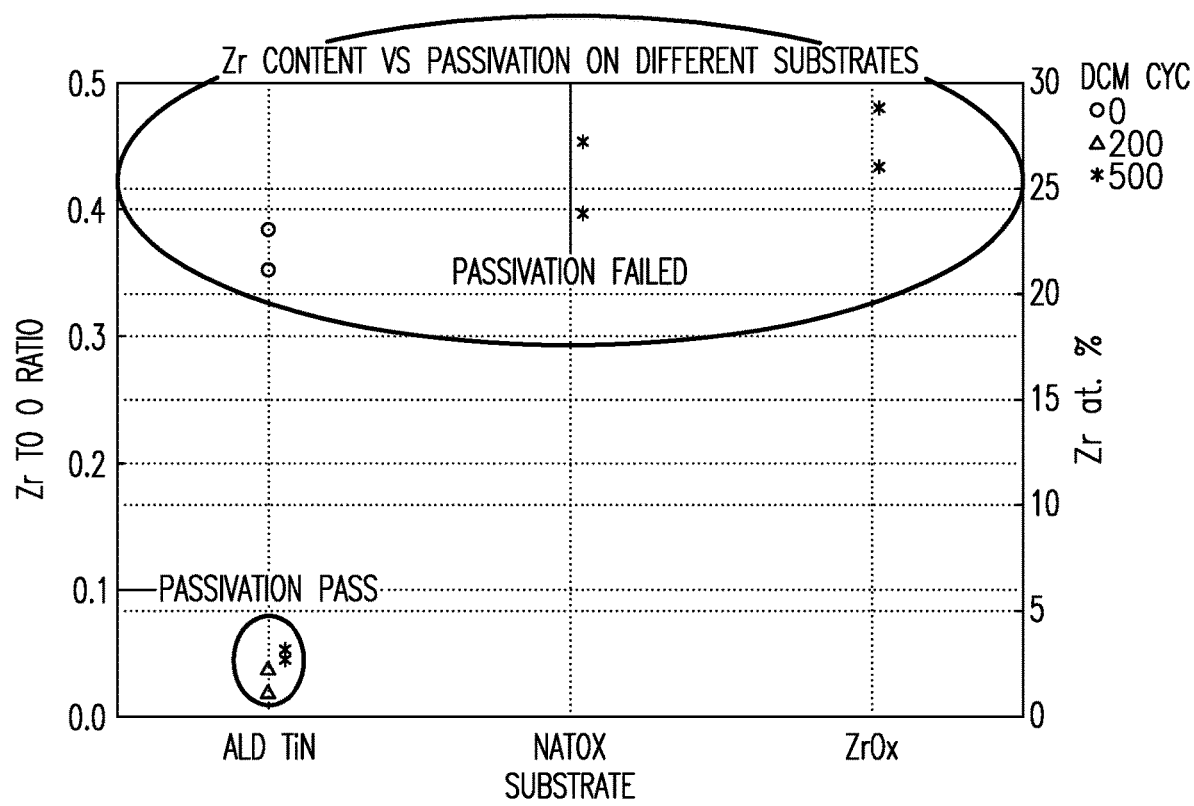
FIG. 9 is a graph showing experimental results for various numbers of cycles of atomic layer deposition of a dielectric on different types of surfaces after exposure to a passivation agent.

FIG. 9 shows the results of the same experiments in a different form and illustrates that that 200 cycles of DCM exposure successfully passivated TiN substrates against $ZrO_2$ ALD, while 500 cycles of DCM exposure failed to passivate dielectric (native oxide and $ZrO_x$) substrates. Water contact angle was also measured before and after DCM exposure and was found to increase from ~25° to ~90° for TiN.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A method for vapor-phase coating, the method comprising:
   passivating a conductive surface against vapor-phase deposition, wherein passivating comprises exposing the conductive surface to a vapor-phase passivating agent to form a passivated conductive surface, wherein the passivating agent comprises a haloalkane of the formulae $C_nH_{2n+1}X$, $C_nH_{2n}X_2$, or $R^1R^2CX$, where:
   $R^1$ and $R^2$ are each individually hydrogen or an alkyl group;
   X is a halogen; and
   n is less than 5; and
   selectively depositing a layer on a dielectric surface relative to the passivated conductive surface by exposing both the passivated conductive surface and the dielectric surface to vapor-phase deposition reactants.

2. The method of claim 1, wherein the passivating agent comprises at least one of dichloromethane and chloromethane.

3. The method of claim 1, wherein the passivated conductive surface comprises hydrophobic terminations or terminations that are inert to the selective deposition of the vapor phase deposition reactants.

4. The method of claim 1, wherein the passivating agent comprises a compound having a molecular mass of less than or equal to 330 g/mol.

5. The method of claim 1, wherein the conductive surface comprises one or more of TiN, W, Co, Cu, Ir or TaN.

6. The method of claim 1, wherein the dielectric surface comprises hafnium oxide, zirconium oxide, titanium oxide, silicon nitride or native oxide.

7. The method of claim 1, wherein the passivating agent is not heated prior to introduction to exposing the conductive surface.

8. The method of claim 1, wherein the conductive surface comprises a metallic surface.

9. The method of claim 1, wherein the dielectric surface comprises an oxide or nitride surface.

10. The method of claim 1, wherein selectively depositing comprises atomic layer deposition.

11. The method of claim 1, wherein passivation of the conductive surface selectively forms the passivated conductive surface relative to the dielectric surface.

12. The method of claim 1, where the passivation forms directly on the conductive surface without blocking passivation on the dielectric surface and without catalytic agents on the conductive surface.

13. The method of claim 1, wherein passivation of the conductive surface is performed in about 1 day or less.

14. A method for vapor-phase coating, the method comprising:
   passivating a conductive surface against vapor-phase deposition, wherein passivating comprises exposing the conductive surface to a vapor-phase passivating agent to form a passivated conductive surface, wherein the passivating agent comprises a halogen containing silane, halogen containing germane or a compound of the formulae $SiH_2X_2$, $SiH_3X$, $GeH_2X_2$ or $GeH_3X$, where X is a halogen; and
   selectively depositing a layer on a dielectric surface relative to the passivated conductive surface by exposing both the passivated conductive surface and the dielectric surface to vapor-phase deposition reactants.

15. A vapor-phase deposition process comprising:
   passivating a conductive surface against vapor-phase deposition, wherein passivating comprises exposing the conductive surface to a passivating agent comprising a vapor-phase halide to form a passivated conductive surface, wherein the passivating agent comprises a haloalkane of the formulae $C_nH_{2n+1}X$, $C_nH_{2n}X_2$, or $R^1R^2CX$, where:
   $R^1$ and $R^2$ are each individually hydrogen or an alkyl group;
   X is a halogen; and
   n is less than 5; and
   selectively depositing a layer on a dielectric surface relative to the passivated conductive surface by exposing both the passivated conductive surface and the dielectric surface to vapor-phase deposition-reactants.

16. The method of claim 15, wherein the conductive surface comprises oxygen.

17. The method of claim 15, wherein the passivating agent comprises at least one of dichloromethane and chloromethane.

* * * * *

UNITED STATES PATENT AND TRADEMARK OFFICE
CERTIFICATE OF CORRECTION

PATENT NO. : 10,900,120 B2  
APPLICATION NO. : 16/033952  
DATED : January 26, 2021  
INVENTOR(S) : Varun Sharma et al.

Page 1 of 1

It is certified that error appears in the above-identified patent and that said Letters Patent is hereby corrected as shown below:

On the Title Page

On Page 3, Column 1, Item (56), Line 45, under U.S. Patent Documents, delete "5/2014 Swaminathan et al." and insert --9/2014 Niskanen et al.--.

In the Claims

In Column 16, Line 6, Claim 12, delete "1," and insert --11,--.

Signed and Sealed this  
Twenty-fifth Day of May, 2021

Drew Hirshfeld  
*Performing the Functions and Duties of the  
Under Secretary of Commerce for Intellectual Property and  
Director of the United States Patent and Trademark Office*